United States Patent
Salama et al.

(10) Patent No.: US 9,211,609 B2
(45) Date of Patent: Dec. 15, 2015

(54) LASER VIA DRILLING APPARATUS AND METHODS

(75) Inventors: Islam A. Salama, Chandler, AZ (US); Nathaniel R. Quick, Lake Mary, FL (US); Aravinda Kar, Oviedo, FL (US)

(73) Assignee: Intel Corporation, Santa Clara, CA (US)

( * ) Notice: Subject to any disclaimer, the term of this patent is extended or adjusted under 35 U.S.C. 154(b) by 2295 days.

(21) Appl. No.: 11/319,824

(22) Filed: Dec. 28, 2005

(65) Prior Publication Data

US 2007/0145024 A1   Jun. 28, 2007

(51) Int. Cl.
| | |
|---|---|
| B23K 26/00 | (2014.01) |
| B23K 26/38 | (2014.01) |
| B23K 26/073 | (2006.01) |
| H01L 21/311 | (2006.01) |
| H05K 3/00 | (2006.01) |
| B23K 26/40 | (2014.01) |

(52) U.S. Cl.
CPC ........... B23K 26/381 (2013.01); B23K 26/0734 (2013.01); B23K 26/382 (2015.10); B23K 26/385 (2013.01); B23K 26/403 (2013.01); B23K 26/408 (2013.01); H01L 21/31138 (2013.01); H05K 3/0026 (2013.01); B23K 2201/40 (2013.01)

(58) Field of Classification Search
CPC ......... B23K 26/00; B23K 26/38; B23K 26/06
USPC ............... 219/121.6, 121.71, 121.73, 121.68, 219/121.67, 69, 121.75; 359/207.7, 358
See application file for complete search history.

(56) References Cited

U.S. PATENT DOCUMENTS

| | | | | |
|---|---|---|---|---|
| 5,148,442 | A * | 9/1992 | O'Neil et al. | 372/71 |
| 6,307,799 | B1 * | 10/2001 | Ngoi et al. | 365/215 |
| 6,491,686 | B2 * | 12/2002 | Lemberg | 606/4 |
| 6,784,399 | B2 * | 8/2004 | Dunsky et al. | 219/121.68 |
| 6,952,510 | B1 * | 10/2005 | Karlsen et al. | 385/37 |

FOREIGN PATENT DOCUMENTS

| | | | | | |
|---|---|---|---|---|---|
| JP | 03159183 | A * | 7/1991 | | H01S 3/08 |
| JP | 07214360 | A * | 8/1995 | | B23K 26/06 |
| JP | 11254160 | A * | 9/1999 | | B23K 26/00 |

(Continued)

OTHER PUBLICATIONS

S. Quabis et al., "Focusing light to a tighter spot", May 25, 2000, Optics Communications 179 (2000) 1-7, 0030-4018/00, © 2000 Elsevier Science B.V.

R. Dorn et al., "Sharper Focus for a Radially Polarized Light Beam", Physical Review Letters, Dec. 5, 2003, vol. 91, No. 23, © 2003 The American Physical Society, pp. 233901-1 to 233901-4.

(Continued)

*Primary Examiner* — Dana Ross
*Assistant Examiner* — Ayub Maye
(74) *Attorney, Agent, or Firm* — Buckley, Maschoff & Talwalkar LLC (57) ABSTRACT

A method includes generating a laser beam and applying the beam to a substrate to form a via in the substrate. The laser beam has an intensity profile taken at a cross-section transverse to the direction of propagation of the beam. The intensity profile has a first substantially uniform level across an interior region of the cross-section and a second substantially uniform level across an exterior region of the cross-section. The second intensity level is greater than the first intensity level.

11 Claims, 8 Drawing Sheets

(56) References Cited

FOREIGN PATENT DOCUMENTS

| | | | | |
|---|---|---|---|---|
| JP | 2003236690 A | * | 8/2003 | ............. B23K 26/00 |
| JP | 2005161362 A | * | 6/2005 | ............. B23K 26/00 |

OTHER PUBLICATIONS

"Certificate of Accuracy Translation of Japanese Patent Application No. H11-254160 with English Translation", Sep. 21, 1999, 20pgs.

* cited by examiner

FIG. 9

LASER VIA DRILLING APPARATUS AND METHODS

BACKGROUND

It is a known technique to use a laser to drill holes for vias in substrates for use with electronic equipment. For example, laser via drilling has been employed in connection with substrates used as the base members for packages that house integrated circuits (ICs) such as microprocessors.

As it becomes desirable to drill vias having smaller diameters than those typically formed at the present time, conventional laser drilling techniques may fail to produce satisfactory results. One particular challenge lies in producing via holes that are clean, and free of residue that may be produced by some drilling techniques.

DETAILED DESCRIPTION

Figure 1:
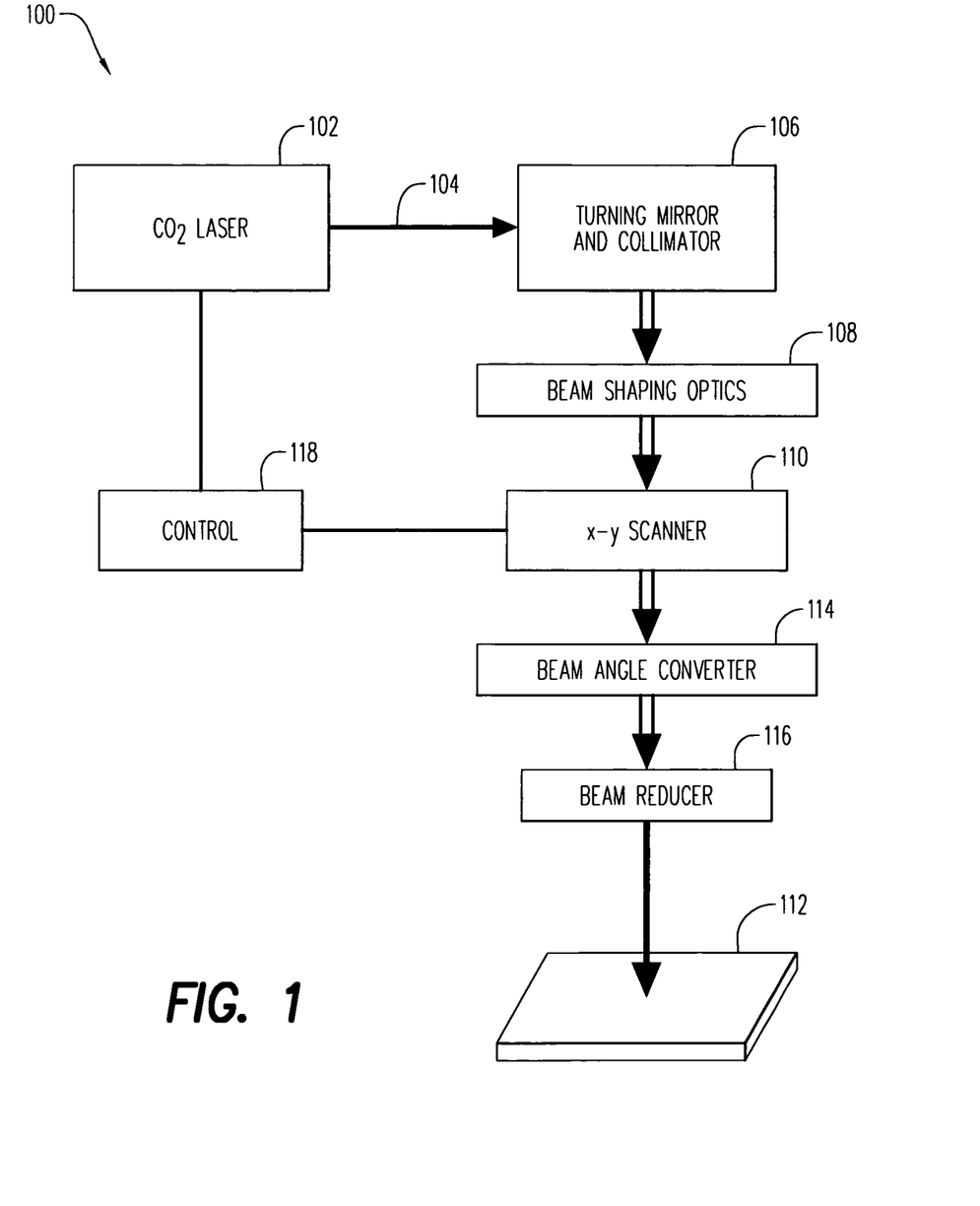
FIG. 1 is a block diagram representation of a laser drilling apparatus according to some embodiments.

FIG. 1 is a block diagram representation of a laser drilling apparatus 100 according to some embodiments. The laser drilling apparatus 100 includes a laser 102. In some embodiments, the laser 102 may be a conventional $CO_2$, Nd:YAG or excimer laser. For example, the laser 102 may be a $CO_2$ laser that emits an infrared beam 104 at a wavelength of 9.3 micrometers.

The laser drilling apparatus 100 may further include optical element(s) 106 to turn and collimate the beam 104. Still further, the laser drilling apparatus 100 may include a beam shaping optical element 108. The beam shaping optical element 108 is positioned to receive the laser beam and to modify the intensity profile of the laser beam. For example, the laser beam, after passing through the beam shaping optical element 108, may have an intensity profile as now described in connection with FIGS. 2 and 3.

Figure 2:
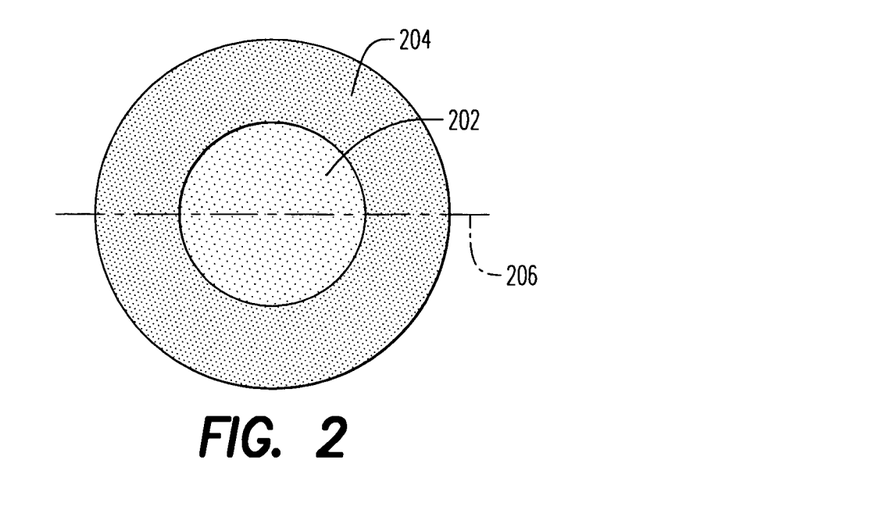
FIG. 2 is a schematic illustration of an intensity profile of a laser beam produced by the apparatus of FIG. 1.

FIG. 2 is a schematic illustration of the intensity profile of the laser beam after it has passed through the beam shaping optical element 108. In particular, FIG. 2 schematically shows an intensity cross-section of the laser beam taken in a plane that is normal to the direction of propagation of the beam. As illustrated in FIG. 2, the intensity profile has a first substantially uniform level across an interior region 202 of the cross-section. The interior region 202 is substantially circular and is at the center of the beam. The intensity profile also has a second (higher) substantially uniform level across an exterior region 204 of the cross-section. The exterior region 204 is substantially annular and surrounds the interior region 202. It will also be noted that the exterior region 204 is concentric with the interior region 202. The ratio of the widths of the interior and exterior regions may be larger or smaller than as illustrated in the drawing. For example, the width of the exterior region may be 10% to 50% of the width of the interior region.

Figure 3:
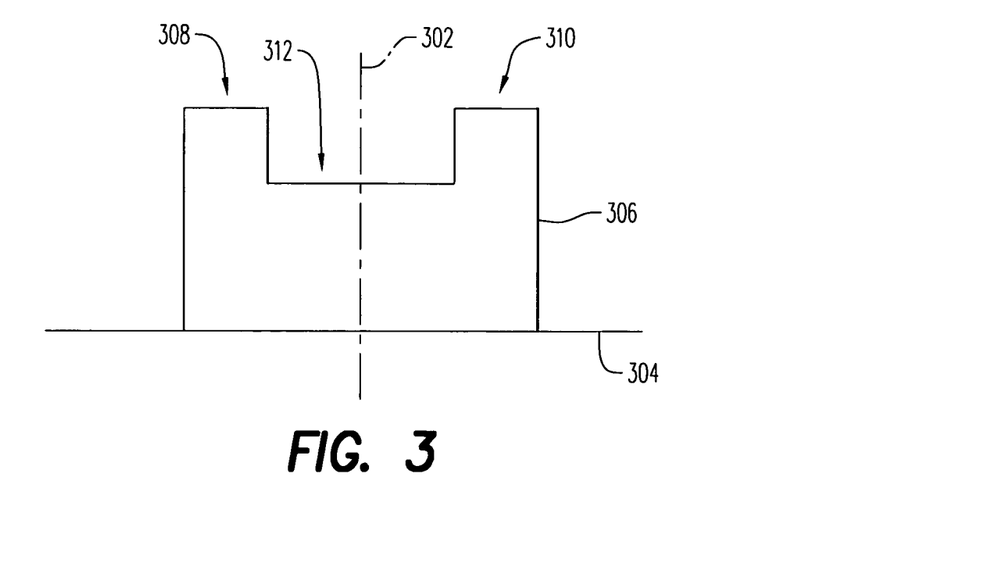
FIG. 3 graphically illustrates variations in intensity level of the laser beam taken along a line that intersects at right angles a central longitudinal axis of the beam.

FIG. 3 graphically illustrates variations in intensity level of the laser beam taken along a line 206 (FIG. 2) that intersects at right angles a central longitudinal axis of the beam. In FIG. 3, the vertical axis 302 represents intensity level and the horizontal axis 304 represents position along the line 206 (FIG. 2). The curve 306 shows the intensity level of the beam as a function of position along the line 206. The portions of the curve 306 at 308 and 310 indicate the relatively high substantially uniform intensity of the beam in the exterior region 204 (FIG. 2) of the intensity profile cross-section. The portion 312 (FIG. 3) of the curve 306 indicates the somewhat lower substantially uniform intensity of the beam in the interior region 202 (FIG. 2) of the intensity profile cross-section. The ratio of the higher (exterior region) intensity level to the lower (interior region) intensity level may be more or less than the ratio indicated in the drawing. For example, the intensity level in the exterior region may be 10% to 50% greater than the intensity level in the interior region.

It will be understood, in short, that the beam, after passing through the beam shaping optical element 108, is stronger at its periphery than at its center. As suggested by the intensity curve in FIG. 3, the beam shape may be such that the beam is characterized as a "fork beam". As will be discussed further below, the fork beam produced by the beam shaping optical element 108 may promote improved via hole drilling performance as compared, for example, to use of a conventional Gaussian beam intensity profile.

The beam shaping optical element 108 may be formed as a diffractive optical element designed to produce the beam profile as described above. Design of such a diffractive optical element, given the specified beam profile, is well within the ability of those who are skilled in the design of diffractive optical elements. In some embodiments, it may be advantageous to form the beam shaping optical element 108 of one of the following materials—GaP, GaAs, SiC and GaN—rather than using a conventional material such as ZnSe. It is noted that ZnSe is toxic and more expensive than an alternative material such as GaP, GaAs, SiC and GaN.

Referring again to FIG. 1, the laser drilling apparatus 100 may include X—Y scanning optics 10, which shifts the locus of the beam in a horizontal plane so that the beam may be directed to a desired point on a substrate 112 in which one or more via holes are to be drilled. The X—Y scanning optics may be provided in accordance with conventional principles.

The laser drilling apparatus 100 may also include a beam angle converter optical element 114. The beam angle converter optical element 114 receives the laser beam after it has passed through the beam shaping optical element 108 and the X—Y scanning optics 110 and converts the angle of the beam relative to the plane of the substrate 112 from an oblique angle to a normal angle. The beam angle converter optical element 114 may be provided as a diffractive optical element. Design of such a diffractive optical element is well within the ability of those who are skilled in the design of diffractive optical elements. It again may be advantageous to form the beam angle converter optical element from one of GaP, GaAs, SiC and GaN.

In addition, the laser drilling apparatus 100 may include a beam reducer optical element 116. The beam reducer optical element 116 receives the laser beam after it has passed through the beam shaping optical element 108, the X—Y scanning optics 110 and the beam angle converter optical element 114. The beam reducer optical element 116 reduces the diameter of the beam, thereby focusing the beam. For example, after passing through the beam reducer optical element 116, the beam may have a diameter of about 40 micrometers, which may be the desired diameter of the via hole(s) to be drilled in the substrate 112. The beam reducer optical element 116 may be provided as a diffractive optical element. Design of such a diffractive optical element is well within the ability of those who are skilled in the design of diffractive optical elements. It again may be advantageous to form the beam reducer optical element from one of GaP, GaAs, SiC and GaN.

The beam reducer optical element 116 may, in some embodiments, be a bifocal lens or a bifocal diffractive optical element having different focal lengths at different regions. Such a bifocal optical element may allow the laser beam to be focused onto planes at two or more different depths in the substrate. For example, the inner portion of the beam may be focused onto the top surface of the substrate while the outer portion of the beam may be focused onto a plane inside the substrate. On the other hand, the inner portion of the beam may be focused onto a plane inside the substrate while the outer portion of the beam may be focused onto the top surface of the substrate.

Use of the fork beam with a single focal length beam reducer may allow focusing of the laser beam onto a single plane on which the laser intensity is less in the inner region than at the outer region. By contrast, with bifocal optics serving as the beam reducer, maximum laser energy may be applied at two different depths in the inner and outer regions. A beam reducer in the form of bifocal optics may be used to focus either a uniform or fork beam to produce via holes that are clean and free of residue.

One or more additional optical elements, which are not shown, may be provided so as to modify the polarization of the laser beam so that the beam is radially polarized. Radial polarization of the beam may allow for narrower focusing of the beam. (Radial polarization of a light beam is discussed, for example, in an article entitled, "Focusing light to a tighter spot", by S. Quabis, R. Dorn, M. Eberler, O. Gloeckl and G. Leuchs, *Optical Communications*, vol. 179, No. 1, 2000, pp. 1-7.) The order in which various optical components are arranged in the laser drilling apparatus may be varied from the arrangement shown in the drawing and/or described herein.

The laser drilling apparatus 100 may also include a control mechanism 118. The control mechanism 118 may be based on a conventional microprocessor or microcontroller (not separately shown), coupled to program memory (not separately shown). The microcontroller or microprocessor may be programmed by software stored in the program memory to control operation of the laser drilling apparatus 100. The control mechanism 118 may be coupled to the laser 102 and the X—Y scanning optics 110 and/or to other components of the laser drilling apparatus 100. The control mechanism 118 may be programmed to generate pulses of the laser beam in accordance with practices to be described below.

The substrate 112, in which the via hole drilling is to be performed, may be suitable to serve as the base for an IC package. The substrate may be conventional in form, at least prior to drilling, and may be shaped and sized to form the base of an IC package. The substrate may include one or more copper layers with one or more dielectric layers on the copper layer(s). The laser drilling may be performed to create a blind via hole in a dielectric layer, with the hole terminated at a copper layer that underlies the dielectric layer.

Figure 4:
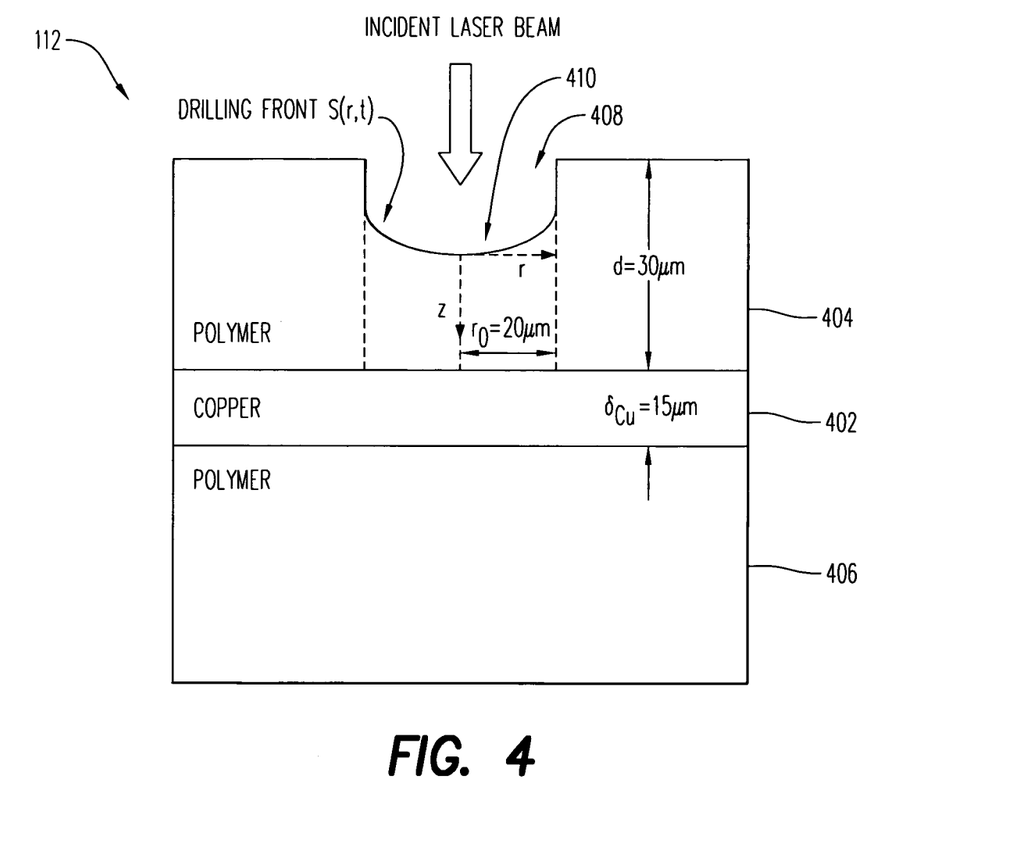
FIG. 4 is a schematic side cross-sectional view that illustrates aspects of drilling in a substrate.

FIG. 4 is a schematic side cross-sectional view that illustrates aspects of drilling in the substrate 112. As seen from FIG. 4, the substrate 112 includes a copper layer 402 that may, in some embodiments, have a thickness of 15 micrometers. The substrate 112 also has an upper polymer dielectric layer 404 on the upper side of the copper layer 402 and a lower polymer dielectric layer 406 on the lower side of the copper layer 402. The upper dielectric layer 404, in which the laser via drilling is to be performed, may have a thickness, in some embodiments, of 30 micrometers. As seen from FIG. 4, a portion of a via 408 has been formed in the dielectric layer 404 by the laser, with the application of the laser continuing to advance a drilling front S(r,t), indicated by reference numeral 410. The via may have a radius of 20 micrometers, in some embodiments.

Figure 5:
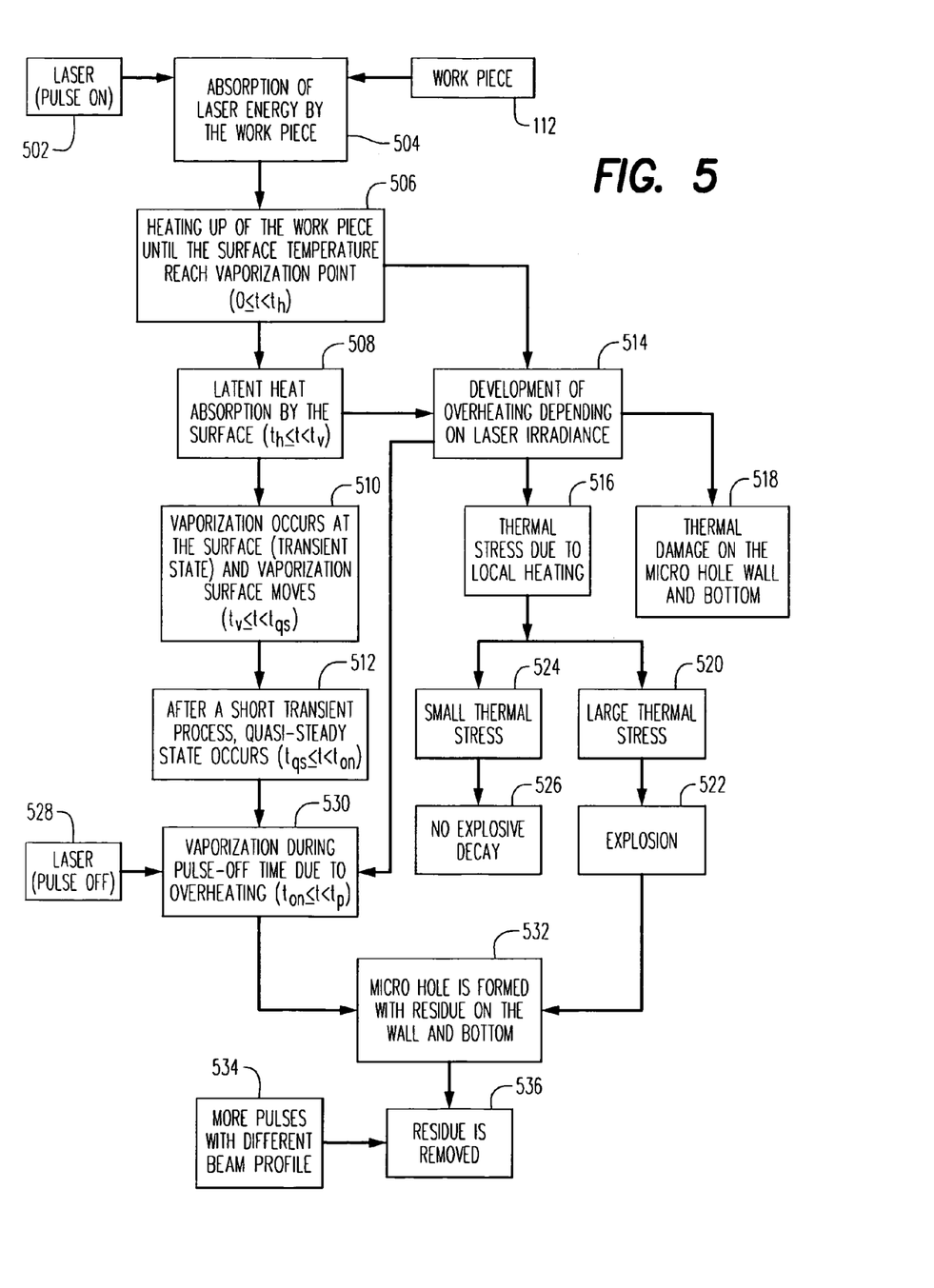
FIG. 5 schematically illustrates interactions of various factors in a laser drilling technique.

FIG. 5 schematically illustrates interactions of various factors in a laser drilling technique. Application of an on-pulse 502 of the laser to the substrate (workpiece) 112 causes the substrate to absorb energy (as indicated at 504) from the laser. This causes the substrate to heat up (as indicated at 506) until the surface of the substrate (at the locus of the laser) reaches the temperature at which the dielectric vaporizes. While this is occurring the surface of the substrate absorbs latent heat, as indicated at 508. The dielectric vaporizes (as indicated at 510) at the surface of the substrate at the locus of the laser and the surface of vaporization moves downward, as the above-mentioned drilling front 410 (FIG. 4). A quasi steady state 512 occurs after a fairly brief transient period, as vaporization at the surface continues.

Meanwhile, as indicated at 514, the heating up of the substrate and the latent heat absorption at the surface of the substrate result in internal overheating of the dielectric material below the surface. This may, in turn, cause thermal stress 516 below the surface of the substrate, and possibly may lead to thermal damage 518 at the via hole wall and/or floor, if the laser is not optimally applied. If the thermal stress is large (520—i.e., larger than the yield stress of the dielectric), then an explosive removal 522 of dielectric material occurs, resulting in an increase in the depth of the via hole beyond that due solely to vaporization of dielectric at the surface of the substrate. If the thermal stress is small (524—i.e., less than the yield stress of the dielectric), then explosive removal of the dielectric does not occur (526).

In the period after the on-pulse of the laser, or in the period between on-pulses, as indicated at 528, surface vaporization may continue 530 as a consequence of the previous internal overheating 514 of the dielectric below the surface of the substrate. Formation of the via hole, indicated at 532, may be the product of both surface vaporization 530 (and/or 510) and explosive removal 522 of material. In some embodiments, e.g., if a Gaussian beam profile is employed for the laser beam, residue may remain at the side wall and/or bottom wall of the via hole. In such a case, after one or more Gaussian beam pulses, a beam pulse with another intensity profile (e.g., an annular half-Gaussian at the beam periphery) may be applied 534 in one or more pulses to remove the residue, as indicated at 536. In other embodiments, the above described fork-beam may be employed in the first instance, and may leave a clean via hole, after an appropriate number of pulses, so that no other pulses with another beam profile may be required.

Figure 6:
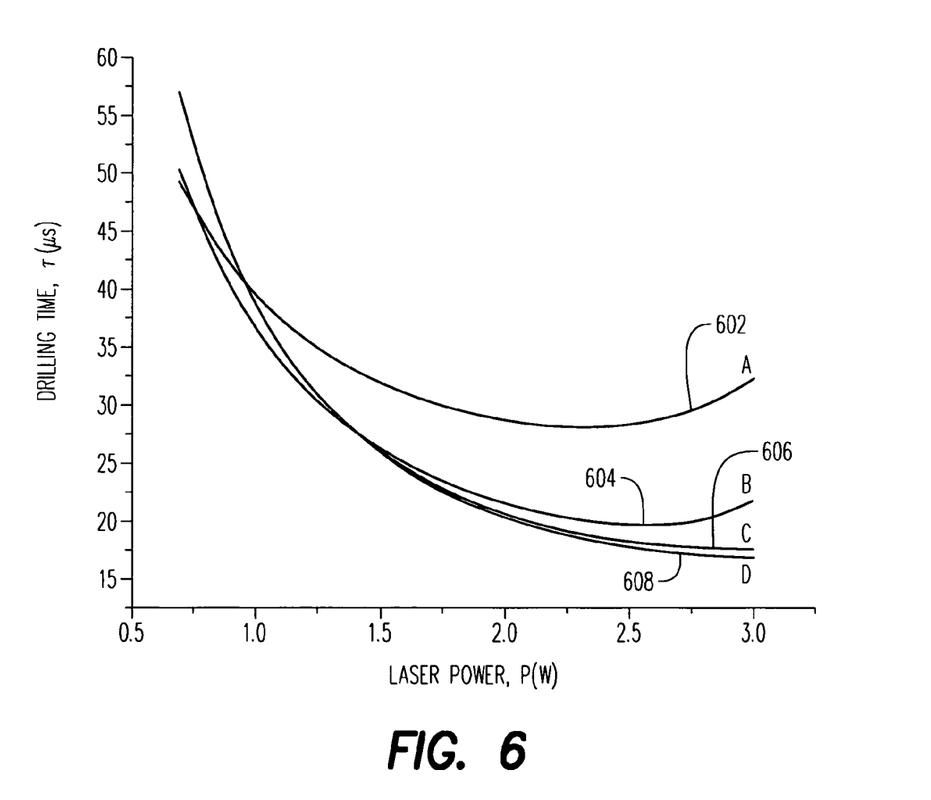
FIG. 6 is a graph that illustrates simulated data regarding dependence of drilling time on laser power for various pulse widths according to some laser drilling techniques.

FIG. 6 is a graph that illustrates simulated data regarding dependence of drilling time on laser power for various pulse widths according to some laser drilling techniques. The pulse repetition rate used for the simulated data of FIG. 6 is 20 kHz. The indicated drilling time (vertical axis) is the time required to drill through a 30 micrometer dielectric layer with an underlying copper layer. Curve 602 (also labeled "A") represents simulated drilling time data for a pulse-on time of 20 microseconds. Curve 604 (also labeled "B") represents simulated drilling time data for a pulse-on time of 10 microseconds. Curve 606 (also labeled "C") represents simulated drilling time data for a pulse-on time of 500 nanoseconds. Curve 608 (also labeled "D") represents simulated drilling time data for a pulse-on time of 250 nanoseconds.

In general, laser irradiance increases with increasing laser power, resulting in an increase in drilling speed (decrease in drilling time). However, when longer pulses are employed (curves 602, 604) the drilling time increases after a critical laser power is reached because the thickness of the dielectric layer is reduced to below its absorption length in a single pulse of a high irradiance laser beam. With the reduced dielectric layer thickness, the laser beam passes entirely through the dielectric layer and reaches the underlying copper surface, which reflects the laser beam. Consequently, much of the laser energy is lost rather than contributing to the drilling through the dielectric layer, leading to an increase in drilling time. Moreover, the loss of energy from reflection of the laser beam also reduces the level of the maximum temperature arising from overheating within the dielectric layer. This leads to reduced removal of material during the pulse-off periods. As a result, the total drilling time increases due to the loss of laser energy by reflection and the reduction in overheating. A conclusion that may be drawn is that shorter pulses, e.g., in the nanosecond range (1 nanosecond to 1 microsecond), may promote more efficient laser drilling with the $CO_2$ laser for via diameters of about 40 micrometers.

Figure 7:
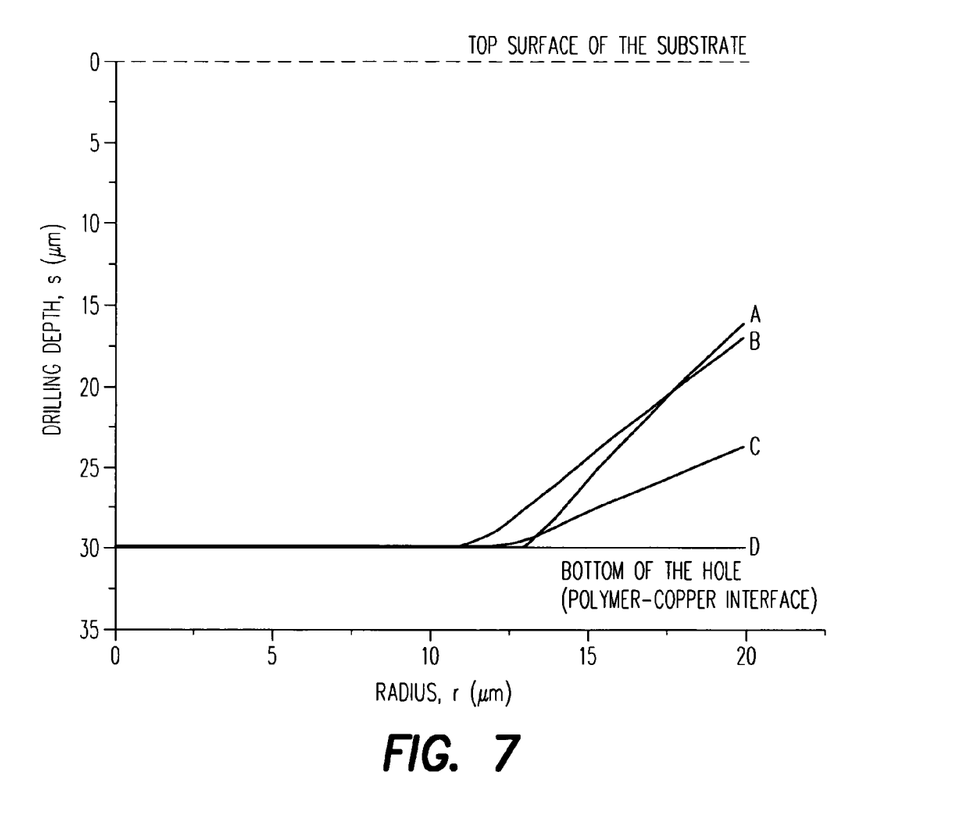
FIG. 7 is a graph that illustrates results obtained in laser via drilling utilizing various beam shapes.

FIG. 7 is a graph that illustrates simulated data for laser via drilling utilizing various beam shapes. The results indicated in FIG. 7 are for two pulses, of various intensity profiles, with a laser power of 1 watt, a pulse on-time of 20 microseconds, and a pulse repetition rate of 20 kHz. In effect the graph indicates profiles of the bottom of the via hole, as left by two pulses of various beam shapes. The vertical axis counts down from the surface of the dielectric layer to the bottom of the via hole, and the horizontal axis shows the distance from the central axis of the via hole. Curve 702 (also labeled "A") shows the profile at the bottom of the hole obtained with two pulses of a Gaussian beam. Curve 704 (also labeled "B") shows the profile at the bottom of the hole obtained with a pulse with a Gaussian beam, followed by a pulse with a full Gaussian annular beam (with maximum intensity at the central circle of the annulus). Curve 706 (also labeled "C") shows the profile at the bottom of the hole obtained with a pulse with a Gaussian beam, followed by a pulse with a half-Gaussian annular beam (with the maximum intensity being at the outer radius of the annulus). Curve 708 (also labeled "D") shows the profile at the bottom of the hole—in this case a desirable cylindrical profile—obtained with two pulses of a beam that has a uniform intensity across its cross-section. It is believed that the fork-beam described above may produce even better results than the uniform beam, at least in terms of throughput, particularly if employed with bursts of short pulses in the nanosecond range.

Figure 8:
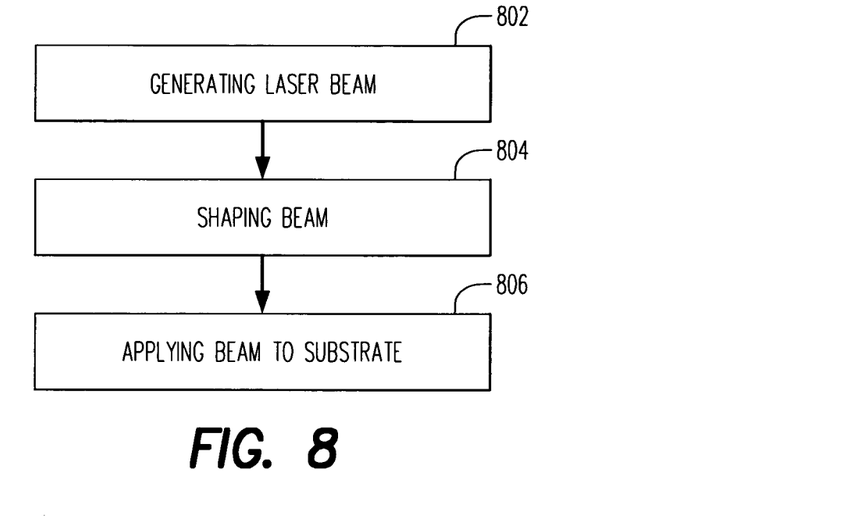
FIG. 8 is a flow chart that illustrates a process performed according to some embodiments.
Figure 9:
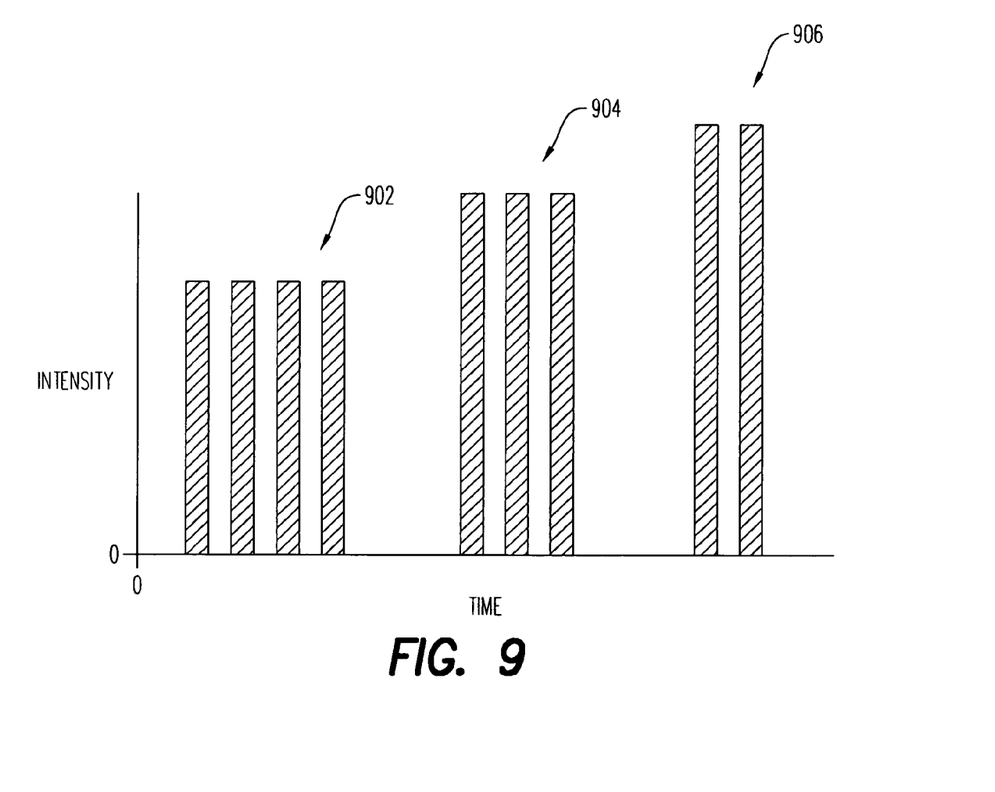
FIG. 9 is a graph that illustrates an example sequence of laser pulses that may be employed in some embodiments.

FIG. 8 is a flow chart that illustrates a process performed according to some embodiments. At 802, the laser beam is generated, e.g., by the above-mentioned $CO_2$ laser 102 (FIG. 1). At 804, the laser beam is shaped, e.g., into the fork-beam profile described above, by a beam shaping optical element such as the diffractive optical element 108. At 806, the fork beam is applied to the substrate 112 to perform laser drilling in the top dielectric layer of the substrate. The control circuit 118 (FIG. 1) may operate such that the laser beam is generated in bursts of short pulses of varying intensity levels. FIG. 9 is illustrative of one of many possible patterns of pulse bursts that may be employed according to some embodiments. In the example shown in FIG. 9 (which is not necessarily drawn to scale), a burst 902 of four pulses at a first intensity level is followed by a burst 904 of three pulses at a second, higher intensity level, and then by a burst 906 of two pulses at a third, still higher intensity level. The width of each pulse may be in the range of 20 to 300 nanoseconds. The pulse repetition rate within each burst may be on the order of 20 to 50 kHz. The time interval between bursts may be 1.5 or more times the interval between pulses within a burst. Many variations are possible from these parameters and from the number of pulses and number of bursts shown. The pulses may be generated by Q-switching the laser. The intensity levels of the pulses may be controlled by controlling the level of energy with which the laser is excited.

The relatively short pulses proposed herein may aid in controlling on a temporal scale the explosive removal of dielectric material. The fork beam may aid in controlling the explosive removal of dielectric material on a spatial scale. The combination of short pulses and the fork beam may serve to substantially eliminate the leaving of residue in the via hole by the drilling process.

Figure 10:
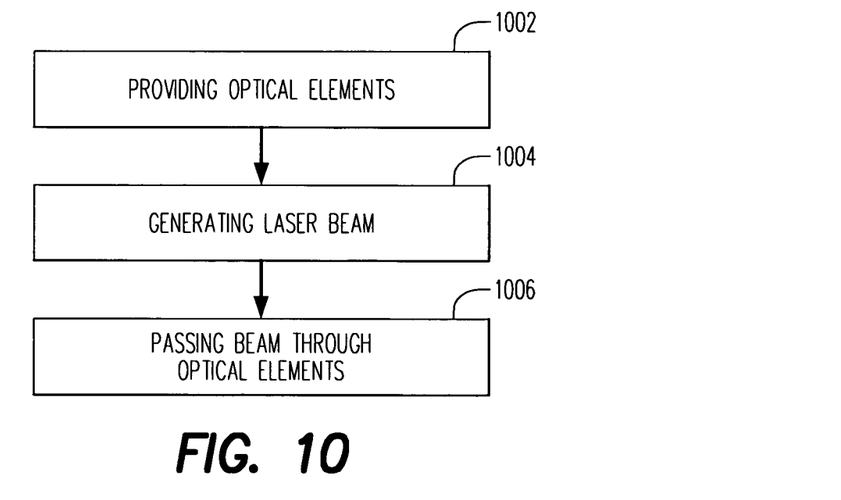
FIG. 10 is a flow chart that illustrates a process performed according to some embodiments.

FIG. 10 is a flow chart that illustrates a process performed according to some embodiments, as considered from another point of view. At 1002 in FIG. 10, optical elements are provided, such as the diffractive optical elements 108, 114, 116 of GaP, GaAs, SiC or GaN, as described above. At 1004, the laser beam is generated by, e.g., the $CO_2$ laser 102. At 1006, the laser beam is passed through the optical elements to, e.g., shape, angle-convert and/or focus the beam.

The above embodiments have been described primarily in the context of drilling blind via holes in a layer of polymeric dielectric for the base substrate of an IC package. The teachings hereof may, however, also be applicable to other laser via drilling operations, including drilling vias in a ceramic dielectric layer.

Whenever herein the materials that may be used for optical elements have been listed as GaP, GaAs, SiC or GaN, it should be understood that these materials are exemplary of other materials that may be used for the optical elements.

The laser beam(s) referred to herein may be in any one of the infrared, visible, ultraviolet and deep ultraviolet ranges of the electromagnetic spectrum and may be generated by $CO_2$, Nd:YAG or excimer lasers, or by frequency multiplication of an Nd:YAG laser.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:
1. A method comprising:
generating a laser beam;
shaping the laser beam with an optical element such that the laser beam has an intensity profile taken at a cross-section transverse to a direction of propagation of the beam, the intensity profile having a first substantially uniform level across an interior region of said cross- section, and having a second substantially uniform level across an exterior region of said cross-section, said second level greater than said first level; and applying the shaped laser beam to a substrate to form a via in the substrate.

2. The method of claim 1, wherein the interior region is substantially circular and the exterior region is substantially annular and surrounds the interior region.

3. The method of claim 1, wherein the via is formed in a dielectric layer on a copper layer, and the substrate is shaped and sized to form a base of a package for an integrated circuit.

4. The method of claim 1, wherein:
said optical element is a diffractive optical element.

5. The method of claim 1, wherein the beam is applied in pulses which each have a duration of less than a microsecond.

6. The method of claim 1, wherein the beam is applied in a series of pulses, including a first pulse, a second pulse and a third pulse, said second pulse following said first pulse in time, said third pulse following said second pulse in time, said second pulse having a higher energy level than said first pulse, said third pulse having a higher energy level than said second pulse.

7. The method of claim 1, wherein the laser beam is generated with a $CO_2$, Nd:YAG or excimer laser.

8. The method of claim 1, wherein the laser beam is radially polarized.

9. The method of claim 5, wherein the pulses are generated by Q-switching.

10. The method of claim 6, wherein there is at least one pulse in said series of pulses between said first and second pulses, and there is at least one pulse in said series of pulses between said second and third pulses.

11. An apparatus comprising: a beam source to generate a laser beam; and a beam shaping optical element positioned to receive the laser beam and to modify an intensity profile of the laser beam, the beam shaping optical element including a material selected from the group consisting of GaP, GaAs, SiC and GaN; wherein the beam source includes a laser device for generating the laser beam, the laser device separate from the beam shaping optical element, wherein the beam shaping optical element includes a material selected from the group consisting of GaP, SiC and GaN.

\* \* \* \* \*